United States Patent [19]

Pinnavaia

[11] Patent Number: 4,995,156
[45] Date of Patent: Feb. 26, 1991

[54] METHOD FOR ASSEMBLING COMPONENTS UPON PRINTED CIRCUIT BOARDS

[75] Inventor: Giuseppe R. Pinnavaia, Rieti, Italy

[73] Assignee: Texas Instruments Incorporated, Dallas, Tex.

[21] Appl. No.: 748,390

[22] Filed: Jun. 25, 1985

[30] Foreign Application Priority Data

Oct. 4, 1984 [IT] Italy ................ 48499 A/84

[51] Int. Cl.$^5$ ............................................. H05K 3/32
[52] U.S. Cl. .................................. 29/838; 29/432.2; 29/832
[58] Field of Search ................. 29/825, 829, 832, 837, 29/838, 844, 845, 432, 432.1, 513, 432.2

[56] References Cited

U.S. PATENT DOCUMENTS

| | | | |
|---|---|---|---|
| 2,990,533 | 6/1961 | Hughes | 439/84 |
| 3,061,762 | 10/1962 | Schlegel | 29/832 X |
| 3,200,481 | 8/1965 | Lenders | 29/838 X |
| 3,228,091 | 1/1966 | Rice et al. | 29/832 |
| 3,443,298 | 5/1969 | Romeo | 29/838 X |
| 4,530,619 | 7/1985 | Becker | 29/432 X |

FOREIGN PATENT DOCUMENTS

| | | | |
|---|---|---|---|
| 536836 | 12/1955 | Italy | 29/838 |
| 798130 | 7/1958 | United Kingdom | 29/838 |
| 1018278 | 1/1966 | United Kingdom | 29/838 |

OTHER PUBLICATIONS

Western Electric, Technical Digest, No. 52, Oct. 1978, "Attaching Leads to Flexible Substrates".
IBM Technical Disclosure, "Standoff or Microminiature Circuit".

Primary Examiner—Joseph M. Gorski
Attorney, Agent, or Firm—James P. McAndrews; John A. Haug; Melvin Sharp

[57] ABSTRACT

Subject-matter of this invention is a method for assembling components, such as M.O.S, devices and the like, upon printed circuit boards by clinching, such method including the steps of providing a board bearing a printed circuit with places upon which a component is to be assembled; applying the component upon the board with its pins in contact with the places of the circuit among which it is to be assembled; pressing the component in order that the pins are forced to penetrate through the thickness of the board; and clinching the end portions of the pins protruding from the back side of the board.

1 Claim, 1 Drawing Sheet

METHOD FOR ASSEMBLING COMPONENTS UPON PRINTED CIRCUIT BOARDS

BACKGROUND OF THE INVENTION

This invention relates to a method for assembling components, such as M.O.S. devices and like, upon printed circuit boards, without resorting to any soldering operation.

As is known, the number of electronic apparatus which include as basic components printed circuit boards upon which active or passive circuit components are assembled is extremely large.

As far as the boards are concerned, a broadly used type of board usually consists of a thin plate of dielectric material, usually polycarbonate or a polyester such as mylar, upon which the network of electric connections, that is the electric circuit itself, is applied upon one or both sides. The circuit components are subsequently applied by means of a separate and independent multiple soldering operation.

Under the term of multiple soldering operation it is to be understood that, even for assembling a single component, having a plurality of pins, a plurality of single soldering operations are typically necessary in order to solder the various pins to be connected to various points of the printed circuit.

This multiple soldering operation in the manufacture of many electronic devices is a real bottle neck of the whole manufacturing process. In fact, it is evident that, whatever the execution times and modes of such soldering operations may be, they are extremely critical because a bad soldering operation can entail conduction irregularities or even ohmic discontinuities, and improperly centered soldered connections can entail burrs or even cause undesired short-circuits.

SUMMARY OF THE INVENTION

It is broadly an object of this invention to provide a method for assembling components upon printed circuit boards, which method is in the first place inexpensive and at the same time permits the disadvantages of the present state of art to be eliminated and quite reliable printed circuits bearing such components to be obtained.

The concept upon which this invention is based is to assemble the components by means of a clinching operation rather than a soldering operation. Under the term of clinching operation an operation is to be understood by which the pins of the involved component are driven under pressure through the thickness of the printed circuit board in the places where such pins should make contact with the printed circuit and thereafter the rearwardly protruding portions are clinched.

The method of this invention, in its preferred embodiment, includes the following step of:

providing a printed circuit board including places upon which an active or passive component is to be assembled;

pressing the component in order to force the pins to completely penetrate through the thickness of the board;

clinching the segments of the pins protruding from the back side of the board.

It has been shown that boards made of mylar bearing printed circuits made by screen printing and conductive paths made with silver paste and graphite paste coating are particularly useful in exploiting the method.

It has been also shown that components having pins with a tapered stem upon which one or two side shoulders are provided intended to abut against the upper surface of the printed circuit board at the edge of the penetration hole are particularly useful in exploiting the method.

Provided that it is not construed as a restriction of the scope of this invention, it is believed that the combination of two contact kinds determine the quality of the connection. In the first place, the contact between the side surface of the stem of each pin with the silver paste and/or the graphite paste that the stem itself entrains by creeping during its forced penetration through the thickness of the board. In the second place, the flat contact between the above mentioned shoulders and the surfaces of the conductive paths against which said shoulders are abutted. As far as this type of contact is concerned, the clinching of the free ends of the pins on the back side of the board is very important because it guarantees a pressure contact.

DESCRIPTION OF THE PREFERRED EMBODIMENTS

Figure 1:
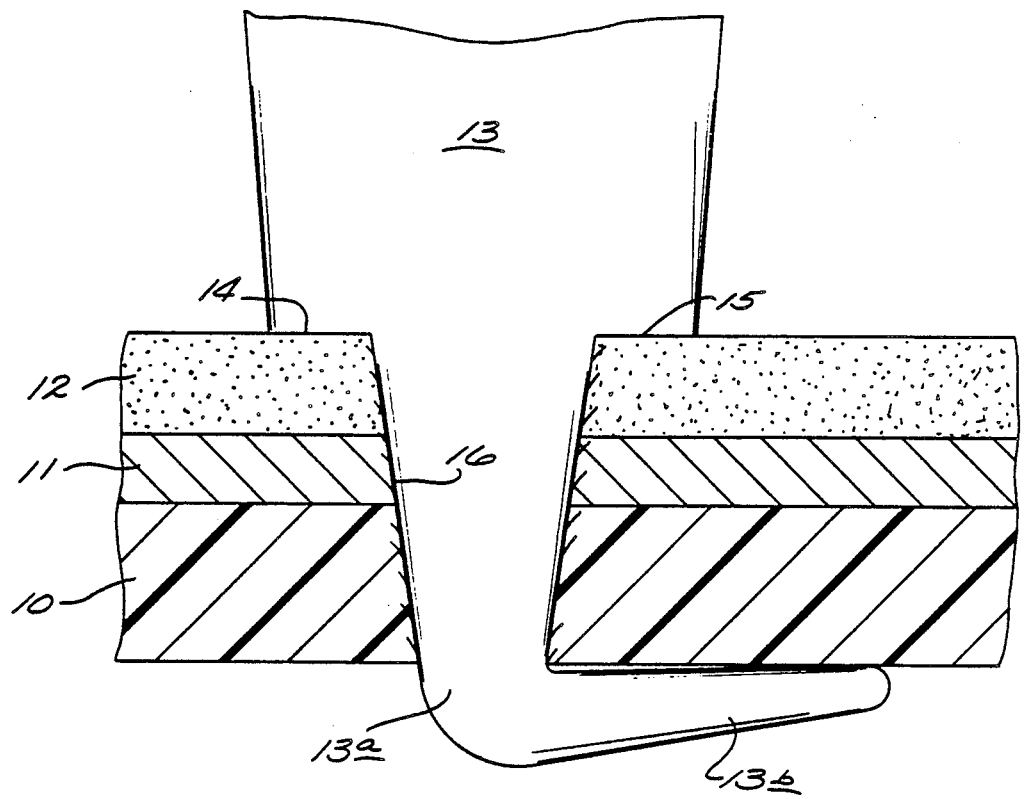

Referring now to the Figure, it can be seen that the printed circuit board, cross-sectioned along the penetration hole of pin 13 of a semiconductor or other electronic component comprises a base film 10 of polyester, polycarbonate or similar synthetic film material, for example mylar, bearing a conductive path consisting of silver paste 11 with a coating of graphite paste 12. A lead or extention from the component has a tapered stem 13a having two shoulders 14 and 15 adjacent its base portion facing the distal end of the tapered pin stems.

The distal ends of the component pins 13 are pressed into the printed circuit board structure at the location of a conductive path so that the tapered end 13a of each selected pin stem penetrates through the circuit board. As above mentioned, after the stem 13a is forced to penetrate through the thickness of the board, the free end 13b of pin 13 is clinched as shown in the Figure. The contact with the conductive path 11, 12 is made not only at shoulders 14 and 15, whereat the contact quality is substantially influenced by clinching the free end 13b of pin 13, but also along the sides of the pin, at 16, with the silver and graphite pastes that stem 13a entrains by creeping along the hole during the forced penetration through the board. As far as this second contact kind is concerned, it is important that the forced penetration be carried out with a sufficient slowness to guarantee a creeping of the conductive material without causing discontinuities.

A further advantage achieved by a construction according to the invention consists in that, should a faulty component be found, it is possible to disassemble and to replace it, the necessity being eliminated to reject the component together with the board on which it is mounted, as in the prior art.

The preferred embodiment has been hereinabove described; it should be understood however that variations and changes can be made thereto by those skilled in the art, without departing from the scope of this invention.

I claim:

1. A method for assembling electronic components upon printed circuit boards comprising the steps of:

providing a printed circuit board to have a selected thickness of conductive material on one side of the board embodied in circuit paths and portions of the circuit paths on which electronic components are to be mounted and to which the electronic components are to be electrically connected;

providing electronic components having lead pins which are tapered toward distal ends thereof and which have shoulders on the pins disposed to face said distal pin ends;

applying the distal ends of the tapered pins of the components upon the board in places on the conductive circuit path material on which and to which the electronic components are to be mounted and connected and pressing the components for forcing the pins to penetrate through the thickness of the board and conductive circuit path material to form respective tapered penetration hole portions in the board and entraining the conductive circuit path material into said tapered penetration hole portions thereby electrically engaging the pins with the entrained conductive circuit path material within the tapered penetration hole portions, abutting said side-shoulders with the conductive circuit path material adjacent the tapered penetration hole portions, and protruding the distal ends of the pins from an opposite back side of the board, said pressing being carried out with sufficient slowness for thereby entraining the conductive circuit path material to creep into the tapered penetration hole portions without discontinuities; and clinching the distal ends of the pins protruding from the back side of the board for retaining the pins and pin shoulders in electrical engagement with the conductive circuit path material.

\* \* \* \* \*